United States Patent Office 3,453,506
Patented July 1, 1969

3,453,506
FIELD-EFFECT TRANSISTOR HAVING INSULATED GATES

Tomisaburo Okumura, Kyoto, Japan, assignor to Matsushita Electronics Corporation, Osaka, Japan, a corporation of Japan Filed Mar. 21, 1967, Ser. No. 624,922
Claims priority, application Japan, Mar. 30, 1966, 41/20,489
Int. Cl. H01l *11/00*
U.S. Cl. 317—235 1 Claim

ABSTRACT OF THE DISCLOSURE

In a multipole insulated gate field effect transistor in which an island domain (or domains) of different conduction type from that of the substrate proper is provided between the source and the drain on the substrate, this invention is characterized in that an electro-conductive electrode (or electrodes) is provided upon the insulating film right above said island domain between the gates, for instance, between the first gate and the second gate. By grounding this electrode (or electrodes), or by connecting it to the source, the static capacitance between the first and second gates can be reduced.

This invention relates to a field effect transistor, and more particularly to a field effect transistor having a plurality of insulated gates and shielding gates.

An object of this invention is to provide an insulated gate field effect transistor having two or more gates, the capacitance between which is very low compared with that in a known similar field effect transistor.

The present invention will now be described in detail with reference to the accompanying drawings in which.

Figure 7:
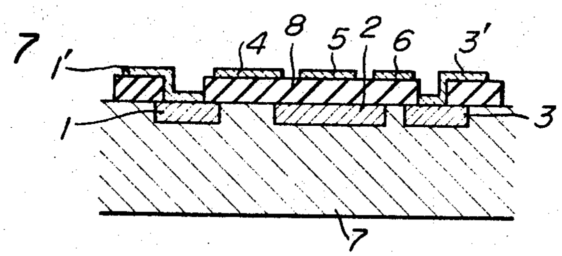
FIG. 7 is a cross-sectional view of a field effect transistor similar to the one shown in FIG. 1, bu tin which the length of the channel underneath two insulated gates are different from each other.
Figure 8:
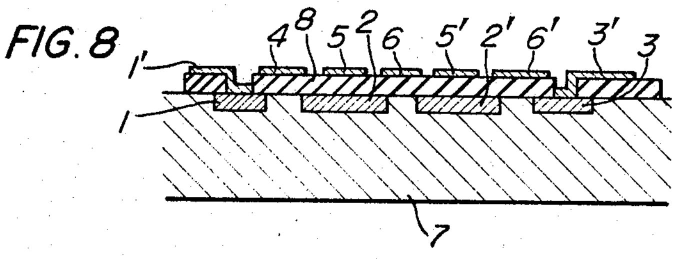
FIG. 8 is a cross-sectional view of a similar transistor which has three insulated gates and two shielding electrodes, the latter being positioned between the former.
Figure 9:
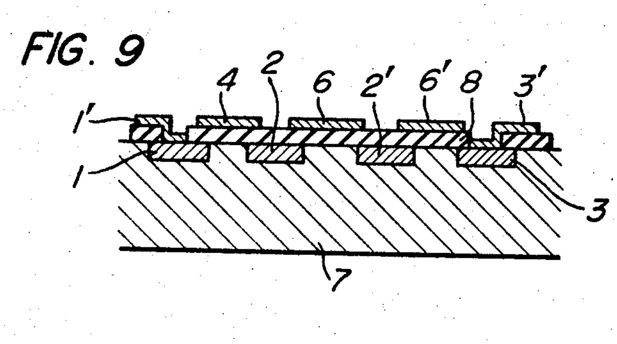
FIG. 9 shows a multiple insulated gate field effect transistor other than this invention, which has two insulated gates but no shielding electrode, the latter being a feature of this invention.

Referring now to the drawings, in which FIGS. 1 to 8 show cross-sections of the transistors in accordance with this invention and FIG. 9 shows a cross-section of a transistor not complying with this invention, and in which the same reference numerals are used to designate the same elements throughout FIGS. 1 to 9, the numeral 1 represents the current inlet electrode commonly called a source, 1′ is a metallic film attached to the source 1, 3 is the current outlet electrode called a drain, and 3′ is the metallic film attached to the drain 3. The numeral(s) 2 (and 2′) hereinafter referred to as an island is a special domain (or domains) provided on the semiconductor substrate 7 midway between the source and the drain. The afore-mentioned source 1, drain 3 and the island(s) 2 (and 2′) differ in conduction type from the semiconductor substrate 7. For example, when P type is used for the semiconductor substrate 7, the source 1, drain 3 and the island(s) 2 (and 2′), are of the N type. On the contrary, when the substrate 7 is of the N type, the source 1, drain 3 and the island(s) 2 (and 2′) are of the P type. In the examples shown in FIGS. 1 to 7, one island 2 is provided.

In FIGS. 8 and 9, examples wherein two islands are provided are shown, and in these figures, the island located farthest from the source 1 is distinguished as 2′. In FIGS. 1 to 7 are illustrated the transistors wherein two gates are provided, gate 4 being located near the source 1, and gate 6 near the drain 3. In the following description, gate 4 near the source is called the first gate, and gate 6 near the drain is called the second gate.

When there are two islands 2 and 2′ as in FIGS. 8 and 9, three gates are provided. These gates are hereinafter referred to as the first gate, the second gate and the third gate, beginning from the source side going toward the drain. In the drawings the first gate, the second gate, and the third gate are designated as 4, 6 and 6′, respectively.

Figure 1:
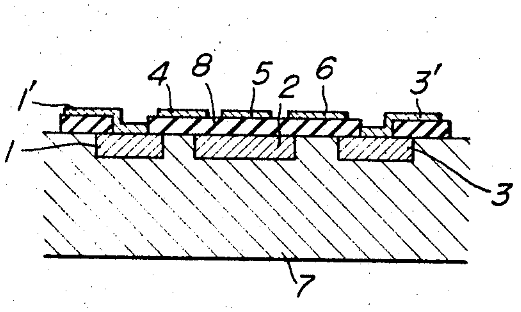
FIG. 1 is a cross-sectional view illustrating the principle of a field effect transistor having two insulated gates and a shielding electrode in accordance with this invention.
Figure 2:
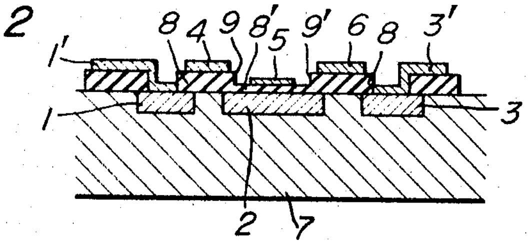
FIG. 2 is a cross-sectional view of field effect transistor similar to the one shown in FIG. 1 but modified in the mode of attaching the shielding electrode.

In FIGS. 1 to 9, the numeral 8 indicates the insulating film which insulates each gate from the substrate 7. The thickness of the film 8 is regionally varied, that is, in FIGS. 2 to 6, the thinner part of the film is represented by 8′, thereby distinguishing it from the thicker part 8. In FIGS. 2 to 6, the numeral 9 shows the upright face bordering 8 and 8′. In the case of FIG. 2 wherein two such borders exist, the upright face of the second border is shown by 9′. In FIGS. 2 to 7, the numeral 5 is the electrode characterizing this invention. This electrode is provided on the insulating film, interposed between the first and the second gates, insulated from both gates, and is composed of a metallic film similar to the gates. This electrode 5 is hereinafter referred to as the shielding electrode. In the example of FIG. 8, one more such electrode 5′ is provided between the second gate 6 and the third gate 6′.

In FIGS. 1 to 9, each gate completely covers the part of the semiconductor substrate 7 remaining between the source, the island(s) and the drain, with the oxide film interposing between these two groups, and is so arranged as to overlap with each domain of the source, the island and the drain when seen in the plane view. The main object of such arrangement in which the gates overlap with the source, the island and the drain in the insulated gate field effect transistor of MOS type using silicon as the semiconductor, silicon dioxide as the insulating film and aluminum as the gate is that: the surface states on the channel, that is the conductive passages formed on the semiconductor surface between the source, the island and the drain, are reduced by the above-mentioned overlapping, and thus, the characteristics of the MOS transistor, e.g. the mutual conductance and the temperature stability, are improved. When a transistor having the structure of FIG. 1 with the shielding electrode 5 omitted, is used with the second gate 6 A.C. grounded, the capacitance between the first gate 4 and the drain 3, i.e. the capacitance usually called a feed-back capacity, is greatly reduced. However, when such a transistor as the aforementioned one having more than two gates is used with separate signals being applied to the first gate and the second gate, the second gate cannot be grounded, resulting in an inconvenience which often arises from the capacitive coupling due to the static capacitance between the first and the second gates.

The present invention provides an effective measure for reducing the capacitive coupling between the first and the second gates, wherein the shielding elecrtode, indicated by 5 in FIGS. 1 to 8 is arranged, as shown in the drawings, between the first gate 4 and the second gate 6, and is grounded or connected to the source 1, thus reducing capacitive coupling between the first gate 4 and the second gate 6. Although the installation of such a shielding electrode 5 is at a glance considered to be in the same vein, in terms of the space relationship, with the installation of the three gates, i.e., the first, second and third gates in the electrode construction of a multipole MOS transistor as shown in FIG. 9, and its grounding is analogous to the A.C. grounding of the second gate of the latter type for the reduction of the static capacitance between the first gate 4 and the third gate 6; the island 2 in the construction of FIG. 2 is formed by means of diffusion or the like means to yield such a small specific resistance as of the order of several m. Ω, whereas the passage between the islands 2 and 2′ in FIG. 9 has a far greater resistance than this, even when a conductive passage exists therebetween, and when the second gate 6 is directly connected to the source 1, the conductive passage disappears, presenting a very high resistance. Accordingly, with the structure of FIG. 9, a greater voltage drop between the source and the drain is caused across the passage between these islands 2 and 2′. In contrast, with such an arrangement as shown in FIG. 1 embodying this invention, because of the low resistance of the island 2, the consumption of the voltage between the source and the drain is substantially zero. In other words, this invention contributes much to the service condition through its abiilty of being used with lower source voltage.

Figure 10:
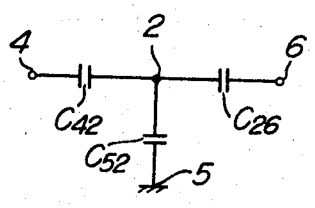
FIG. 10 shows an equivalent connection diagram explaining the principle of this invention.

In the following, the principle of static capacity reduction owing to the addition of the electrode 5 is explained by the equivalent connection diagram shown in FIG. 10.

Thus, $C_{42}$ indicates the static capacitance between the first gate 4 and the island 2, $C_{52}$ denotes the static capacitance between the shielding electrode 5 and the island 2, and $C_{26}$ denotes the static capacitance between the island 2 and the second gate 6. In FIG. 10, the parts shown by 2, 4, 5 and 6 show the island, the first gate, the shielding electrode and the second gate respectively, as in the case of FIG. 2. The A.C. voltage between the first gate and the ground, if there exists no $C_{52}$, is led to the second gate through $C_{42}$ and $C_{26}$, but is shunted to the ground through $C_{52}$, when $C_{52}$ is in existence. Accordingly, if $C_{52}$ is large, in comparison with $C_{42}$, the A.C. current led to the second gate through $C_{26}$ will be much reduced, and in this way, the first gate and the second gate are nearly completely shielded from each other.

In FIG. 2, the electrodes in this structure are installed in an alternative arrangement. Namely, the shielding electrode 5 is installed on the oxide film 8′ which is made thinner than the film 8 beneath the gates 4 and 6. Because the oxide film 8′ is made thinner, the capacitance between the shielding electrodes 5 and island 2 may be increased per unit area, and as a result, the shielding electrode 5 requires a smaller area in order to have the similar capacitance. If its area is unaltered, the capacitance between the shielding electrode and the island increases, thereby further reducing the capacitive coupling between the first and the second gates.

Figure 3:
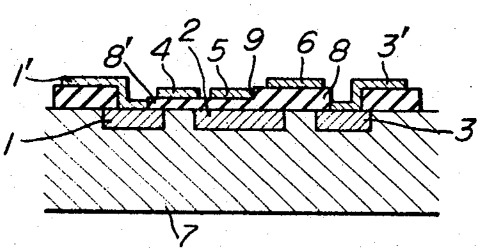
FIGS. 3 and 4 are cross-sectional views of an N channel type field effect transistor in which the thickness of the oxide layer underneath the gate adjacent to the drain is varied from that underneath the gate adjacent to the source.
Figure 4:
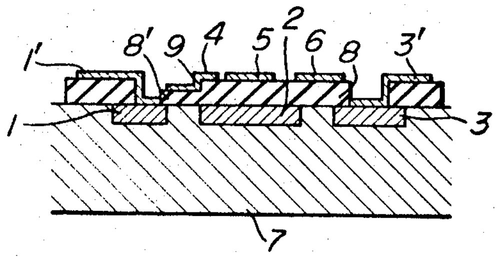

FIGS. 3 and 4 illustrate N channel type MOS transistors, in which the oxide film under the first gate 4 is different in thickness from the oxide film under the second gate 6, the oxide film 8 under the second gate 6 being thicker, and in which the shielding electrode 5 is added in accordance with the present invention.

Figure 5:
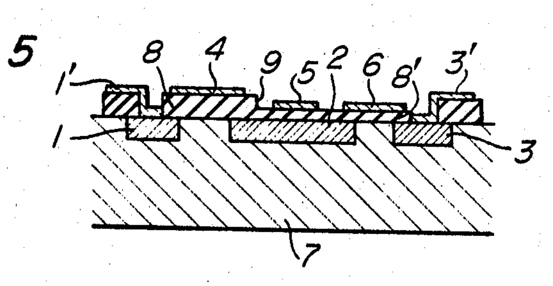
FIGS. 5 and 6 show similar views to FIGS. 3 and 4, but relating to a P channel type field effect transistor.
Figure 6:
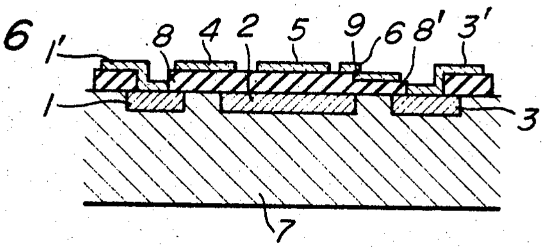

FIGS. 5 and 6 indicate P channel type MOS transistors in which the oxide film 8′ under the second gate 6 is made thinner than that of the oxide film 8 under the first gate with the shielding electrode 5 of this invention added. Referring to FIGS. 3 to 6, oxide films of different thicknesses are provided under the first gate 4 and the second gate 6 to exercise this invention to the effect that, under the same voltage conditions, a greater current is allowed to flow through the first MOS transistor composed of 2, 6 and 3, than through the second transistor composed of 1, 4 and 2, assuming that both two MOS transistors are constituted within the whole transistor. In the N channel type MOS transistor as operated in the depletion mode, and in the P channel type MOS transistor as operated in the enhancement mode, the current and voltage condition mentioned above is at least satisfied. The transistor shown in FIG. 4 is better than that shown in FIG. 3 for the reason that the static capacitance between the first gate and the island is reduced in the transistor shown in FIG. 4. The transistor of FIG. 6 has a smaller static capacitance between the second gate and the island than that shown in FIG. 5, and accordingly, of these two kinds of transistors, the one shown in FIG. 6 is better.

FIG. 7 illustrates a transistor in which the distance between the island 2 and the drain 3 is smaller than the distance between the source 1 and the island 2. In either channel type, the N channel type or the P channel type, a greater current is passable under the same voltage conditions, through the second MOS transistor composed of 2, 6 and 3 than through the first MOS transistor composed of 1, 4 and 2. In this example, the capacitance coupling between the first and the second gates is reduced by the shielding electrode 5.

FIG. 8 illustrates a MOS transistor having the first, the second and the third gates and provided with the shielding electrodes 5 and 5′ added between each set of said gates.

Figure 11:
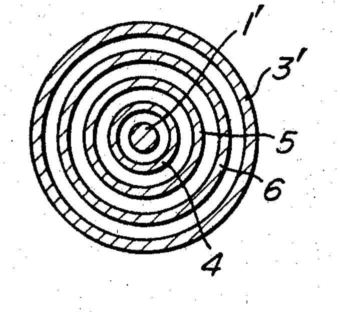
FIG. 11 is a top side view showing an example of the electrode arrangement in the insulated gate field effect transistor having the shielding electrode in accordance with this invention.

FIG. 11 illustrates the top side view of one example of the MOS transistors having the shielding electrode of this invention which has two insulated gates. In this diagram, respective electrodes, that is, the one for the source, the first gate, the shielding electrode, the second gate and the one for the drain are shown. These electrodes are indicated by the same reference numerals as in FIG. 1. Thus 1′ indicates the electrode for the source, 4 denotes the first gate, 5 denotes the shielding electrode, 6 denotes the second gate, and 3′ denotes the electrode for the drain. In case where the source is placed in the center and the drain on the periphery, the perimeter of the source is shorter than the perimeter of the island, and either in the MOS transistor of N channel type or of P channel type, a greater current is passable, under the same voltage conditions through the second MOS transistor composed of the island, the second gate and the drain than through the first MOS transistor composed of the source, the first gate and the island, the former giving more favorable performance.

Figure 12:
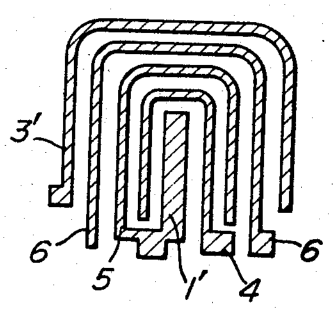
FIG. 12 shows another example of the electrode arrangement in which the source and the shielding electrode are connected to each other on the substrate.

FIG. 12 illustrates the top view of a transistor in which the source 1 and the shielding electrode 5 are connected with a metallic film placed on the transistor surface. The square parts appended to each electrode are the points to which lead wires are connected, and each part is indicated by the same reference numeral as in the previous example. In this example, the source 1 and the shielding electrode 5 which are usually used while being connected together, are joined beforehand in the transistor. Speaking more concretely, by using P type silicon wafers of 2Ω cm., and by employing the structure of such an electrode arrangement as shown in FIG. 11, transistors in which two insulated gates and one shielding electrode are provided, and the shielding electrode is not connected to the source, have been made. The effective perimeter of the source was set at 0.8 mm., the distance between the source and the island 8 microns, and the distance between the island and the drain 8 microns, and the width of the island was 50 microns. The first gate was designed to overlap with the island by 2 microns interposed by the insulating film of silicon dioxide, and the second gate, by 2 microns similarly with the insulating film of oxide interposing therebetween.

The distance between the first gate and the shielding electrode and the distance between the shielding electrode and the second gate both were set at 10 microns. The oxide film is produced by thermal oxidation of silicon with a thickness of 2000 A. The transistor element thus manufactured was sealed in the transistor case of T0–18 type, and the static capacitance between the first and the second gates was then measured. From the measurement on the transistor in which the shielding electrode was connected to the source, the static capacitance between the first and the second gates was found to average 0.03 pf., while the measurement on another transistor, in which the shielding electrode was not connected to any one of the electrodes, thereby being isolated, gave an average of 0.27 pf. Further, when the shielding electrodes was isolated, the capacitance between the first and the second gates was found roughly equal to that obtained when the shielding electrode was not provided. This is probably because the distance between the gates and the shielding electrode is far greater than the thickness of the oxide film. From this result, the capacity between the first and second gates turned out to be reduced to one-ninth, and the capacitive coupling between the first and the second gates was confirmed to be quite effectively reduced by the addition of the shielding electrode.

In the exercise of this invention, in place of silicon, germanium, gallium arsenide, cadmium sulfide, etc., may be used as the semiconductor, and as the insulating film, silicon monoxide, silicon nitride, magnesium fluoride, etc., may be put to use supplanting $SiO_2$.

What is claimed is:

1. A field effect transistor having two or more gates which are insulated from each other and arranged in serial order between the source and the drain, fringe area of each gate overlapping, interposed by the insulating film, with the island domain which is formed on the semiconductor substrate and is of a conduction type different from the substrate, characterized in that a conductive electrode or conductive electrodes are provided on the insulating substrate between two adjacent gates and right above the island domain.

References Cited

UNITED STATES PATENTS

| | | | |
|---|---|---|---|
| 3,333,115 | 7/1967 | Kawakami | 317—235 |
| 3,339,128 | 8/1967 | Olmstead et al. | 317—235 |
| 3,363,166 | 1/1968 | Ohashi et al. | 317—235 |

JOHN W. HUCKERT, *Primary Examiner.*

A. J. JAMES, *Assistant Examiner.*

U.S. Cl. X.R.

317—234